(12) United States Patent
Siegel et al.

(10) Patent No.: US 10,985,778 B2
(45) Date of Patent: Apr. 20, 2021

(54) VERIFYING THE CORRECTNESS OF A DEFLATE COMPRESSION ACCELERATOR

(71) Applicant: International Business Machines Corporation, Armonk, NY (US)

(72) Inventors: Timothy Siegel, Staatsburg, NY (US); Mark Farrell, Pleasant Valley, NY (US); Bruce Giamei, Lagrangeville, NY (US); Matthias Klein, Poughkeepsie, NY (US); Ashutosh Misra, Lagrangeville, NY (US); Simon Weishaupt, Stuttgart (DE); Girish Gopala Kurup, Jagadishnagar (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/741,974

(22) Filed: Jan. 14, 2020

(65) Prior Publication Data
US 2020/0293377 A1    Sep. 17, 2020

Related U.S. Application Data

(62) Division of application No. 16/353,527, filed on Mar. 14, 2019.

(51) Int. Cl.
*H03M 7/34* (2006.01)
*H03M 13/01* (2006.01)
(Continued)

(52) U.S. Cl.
CPC .......... *H03M 13/015* (2013.01); *G06F 7/582* (2013.01); *G06F 9/30149* (2013.01);
(Continued)

(58) Field of Classification Search
CPC ........ H03M 7/3086; H03M 7/40; H03M 7/30; H03M 7/3084; H03M 7/42; H03M 7/4037;
(Continued)

(56) References Cited

U.S. PATENT DOCUMENTS 5,708,511 A * 1/1998 Gandhi ................. H04N 19/50
375/E7.088
5,748,121 A 5/1998 Romriell
(Continued)

FOREIGN PATENT DOCUMENTS

EP      3093999 A1    11/2016
EP      3152840 A1    4/2017

OTHER PUBLICATIONS

"Application Note//Hardware GZIP Decompression", Internet Citation, Jan. 1, 2003 (Jan. 1, 2003), pp. 1-11, XP002758725, Retrieved from the Internet: URL:http://www.mcs.anl.ogv/hereld/PXRF/CeloxicaTraining/GZIP%20App%20Note.pdf[tretrieved on Jun. 14, 2016] section Huffman encoding (for LZ77 output).
(Continued)

*Primary Examiner* — Linh V Nguyen
(74) *Attorney, Agent, or Firm* — Cantor Colburn LLP; William Kinnaman

(57) ABSTRACT

Embodiments of the invention are directed to a DEFLATE compression accelerator and to a method for verifying the correctness of the DEFLATE compression accelerator. The accelerator includes an input buffer and a Lempel-Ziv 77 (LZ77) compressor communicatively coupled to an output of the input buffer. A switch is communicatively coupled to the output of the input buffer and to the output of the LZ77 compressor. The switch is configured to bypass the LZ77 compressor during a compression test. The accelerator further includes a deflate Huffman encoder communicatively coupled to an output of the switch and an output buffer
(Continued)

communicatively coupled to the deflate Huffman encoder. When the switch is not bypassed, the compressor can be modified to produce repeatable results.

11 Claims, 6 Drawing Sheets

(51) Int. Cl.
| | |
|---|---|
| *G06F 9/50* | (2006.01) |
| *H03M 13/00* | (2006.01) |
| *H03M 7/40* | (2006.01) |
| *G06F 7/58* | (2006.01) |
| *G06F 9/30* | (2018.01) |
| *G06F 9/38* | (2018.01) |
| *H03M 7/30* | (2006.01) |

(52) U.S. Cl.
CPC .......... *G06F 9/3802* (2013.01); *G06F 9/5027* (2013.01); *H03M 7/3059* (2013.01); *H03M 7/40* (2013.01); *H03M 7/6011* (2013.01); *H03M 13/6569* (2013.01)

(58) Field of Classification Search
CPC ............. H03M 7/6017; H03M 7/3088; H03M 7/6023; H03M 7/6076; H03M 7/6088; H03M 7/24; H03M 7/3079; H03M 7/46; H03M 7/60; G06F 16/1744; G06F 3/0656; G06F 16/2365; G06F 2212/401; G06F 3/0608; G06F 3/0661; G06F 7/483; G06F 11/08; G06F 17/2258; G06F 17/2276
USPC ................................ 341/51, 65, 67, 106, 107
See application file for complete search history.

(56) References Cited

U.S. PATENT DOCUMENTS

| | | | |
|---|---|---|---|
| 6,040,790 | A | 3/2000 | Law |
| 6,606,328 | B1* | 8/2003 | Susnow ................ H03M 5/145 341/58 |
| 7,307,552 | B2 | 12/2007 | Ma et al. |
| 7,358,870 | B2 | 4/2008 | Bay |
| 7,538,696 | B2 | 5/2009 | Laker et al. |
| 7,609,182 | B2 | 10/2009 | Owsley et al. |
| 8,766,827 | B1 | 7/2014 | Milne et al. |
| 9,030,771 | B2 | 5/2015 | Hostetter |
| 9,176,977 | B2 | 11/2015 | Droege et al. |
| 9,362,948 | B2 | 6/2016 | Kuila et al. |
| 9,577,665 | B2 | 2/2017 | Wu |
| 9,832,287 | B2 | 11/2017 | Sjoholm et al. |
| 9,929,748 | B1 | 3/2018 | Gopal et al. |
| 10,135,463 | B1 | 11/2018 | Satpathy et al. |
| 2006/0184696 | A1* | 8/2006 | Fallon .................. G06F 3/0655 709/247 |
| 2006/0285756 | A1 | 12/2006 | Sugita |
| 2011/0307748 | A1 | 12/2011 | Laisne |
| 2012/0022861 | A1* | 1/2012 | Imthurn ................ H04N 19/91 704/229 |
| 2012/0182163 | A1* | 7/2012 | Cho ........................ H03M 7/30 341/87 |
| 2014/0223030 | A1* | 8/2014 | Bhaskar .................. H04L 69/04 709/247 |
| 2014/0372715 | A1* | 12/2014 | Bak ........................ G06F 12/08 711/158 |
| 2016/0283159 | A1* | 9/2016 | Gopal ................ H03M 7/3095 |
| 2016/0336959 | A1 | 11/2016 | Henry |
| 2017/0115924 | A1* | 4/2017 | Abali ...................... G06F 9/543 |
| 2017/0161203 | A1* | 6/2017 | Alameldeen ............. G06F 9/46 |
| 2018/0121516 | A1* | 5/2018 | Ohtsuji ............... H03M 7/6064 |
| 2019/0123763 | A1* | 4/2019 | Bissessur ............ H03M 7/3084 |
| 2019/0377804 | A1* | 12/2019 | Wu ..................... G06F 16/1744 |

OTHER PUBLICATIONS

Fowers Jeremy et al., "A Scalable High-Bandwidth Archtecture for Lossless Compression on FPGAs", 2015 IEEE 23rd Annual International Symposium on Field-Programmable Custom Computing Machines, IEEE, May 2, 2015 (May 2, 2015), pp. 52-59, XP033177122, DOI: 10.1109/FCCM.2015.46 [retrieved on Jul. 15, 2015].

Hashemian R: "Condensed Table of Huffman Coding, a New Approach to Efficient Decoding", IEEE Transactions on Communications, IEEE Service Center, Piscataway, NJ. USE, vol. 52, No. 1, Jan. 1, 2004 (Jan. 1, 2004), pp. 6-8, XP011106827, ISSN: 0090-6778, DOI: 10.1109/TCOMM.2003.822145, Section III.

Klein S. T., et al., "Huffman Coding with Non-Sorted Frequencies", Data Compression Conference, 2008. DCC 2008, IEEE, Piscataway, NJ, USA, Mar. 25, 2008 (Mar. 25, 2008), p. 526, XP031241232, ISBN: 978-0-7695-3121-2.

Notification of Transmittal of the International Search Report and the Written Opinion of the International Searching Authority, or the Declaration, issued in International Patent Application No. PCT/EP2020/053409, dated Apr. 23, 2020; 14 pages.

Abali et al., "Reducing Latch Count to Save Hardware Area for Dynamic Huffman Table Generation," U.S. Appl. No. 16/751,737, filed Jan. 24, 2020.

Garcia, et al., "Variant of Huffman coding and decoding using words frequencies to improve the compression ratio," ResearchGate: https://www.researchgate.net/publication/258840094; dowloaded Feb. 8, 2014; 9 pages.

Gupta et al., "Deep Learning with Limited Numerical Precision", Proceedings of the 32 nd International Conference on Machine Learning, Lille, France, 2015. JMLR: W&CP vol. 37, Copyright 2015 by the author(s), 10 pps.

List of IBM Patents or Patent Applications Treated as Related; Date Filed: Jan. 24, 2020, 2 pages.

Bulent, Abali et al., "Reducing Latch Count to Save Hardware Area for Dynamic Huffman Table Generation"; U.S. Appl. No. 16/275,608, filed Feb. 14, 2019.

List of IBM Patents or Patent Applications Treated as Related; Date Filed: Jan. 14, 2020, 2 pages.

Siegel et al., "Verifying the Correctness of a Deflate Compression Accelerator," U.S. Appl. No. 16/353,527, filed Mar. 14, 2019.

Slegel et al., "Verifying the Correctness of a Deflate Compression Accelerator," U.S. Appl. No. 16/741,977, filed Jan. 14, 2020.

* cited by examiner

VERIFYING THE CORRECTNESS OF A DEFLATE COMPRESSION ACCELERATOR

DOMESTIC PRIORITY

This application is a divisional of U.S. patent application Ser. No. 16/353,527, filed Mar. 14, 2019, the disclosure of which is incorporated by reference herein in its entirety.

BACKGROUND

The present invention relates to digital computer systems, and more particularly, to digital data compression and decompression schemes employed in digital computer systems.

Digital computer systems perform data compression to realize a more efficient use of finite storage space. The computer system can include a hardware component referred to as a compression accelerator, which accepts work requests or data requests from the host system to compress or decompress one or more blocks of the requested data. When designing an accelerator to perform compression, there is a tradeoff between the size of the input data that is to be compressed compared to the possible compression ratio and the latency that results from compressing the data.

Compression accelerators often utilize a "DEFLATE" algorithm, which is a lossless compression scheme that combines the Lempel-Ziv (e.g., LZ77) compression algorithm with a Huffman algorithm to perform the compression. The computed output from the Huffman algorithm can be viewed as a variable-length code table for encoding a source symbol (such as a character in a file). The Huffman algorithm derives this table from the estimated probability or frequency of occurrence (weight) for each possible value of the source symbol.

SUMMARY

Embodiments of the present invention are directed to an accelerator, such as a DEFLATE compression accelerator. A non-limiting example of the accelerator includes an input buffer and a Lempel-Ziv 77 (LZ77) compressor communicatively coupled to an output of the input buffer. A switch is communicatively coupled to the output of the input buffer and to the output of the LZ77 compressor. The switch is configured to bypass the LZ77 compressor during a compression test. The accelerator further includes a deflate Huffman encoder communicatively coupled to an output of the switch and an output buffer communicatively coupled to the deflate Huffman encoder. When the switch is not bypassed, the compressor can be modified to produce repeatable results.

Embodiments of the present invention are directed to a method for verifying a deflate compression accelerator. A non-limiting example of the method includes requesting, via a test program, a verification test of the deflate compression accelerator. A pseudo random input stream is provided to an input buffer of the deflate compression accelerator. The method includes disabling, by the test program, a Lempel-Ziv 77 (LZ77) compression phase of the verification test and generating, by the deflate compression accelerator, output data based on the pseudo random input stream.

Embodiments of the present invention are directed to a computer program product for verifying a deflate compression accelerator. A non-limiting example of the computer program product includes program instructions executable by an electronic computer processor to control the computer system to perform operations. The operations can include requesting a verification test of the deflate compression accelerator and providing a pseudo random input stream to an input buffer of the deflate compression accelerator. The operations can further include enabling an LZ77 compression phase of the verification test and loading the pseudo random input stream in a history buffer of the deflate compression accelerator. The history buffer can include a page crossing indicator. The operations can further include receiving, from the deflate compression accelerator, output data based on the pseudo random input stream.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
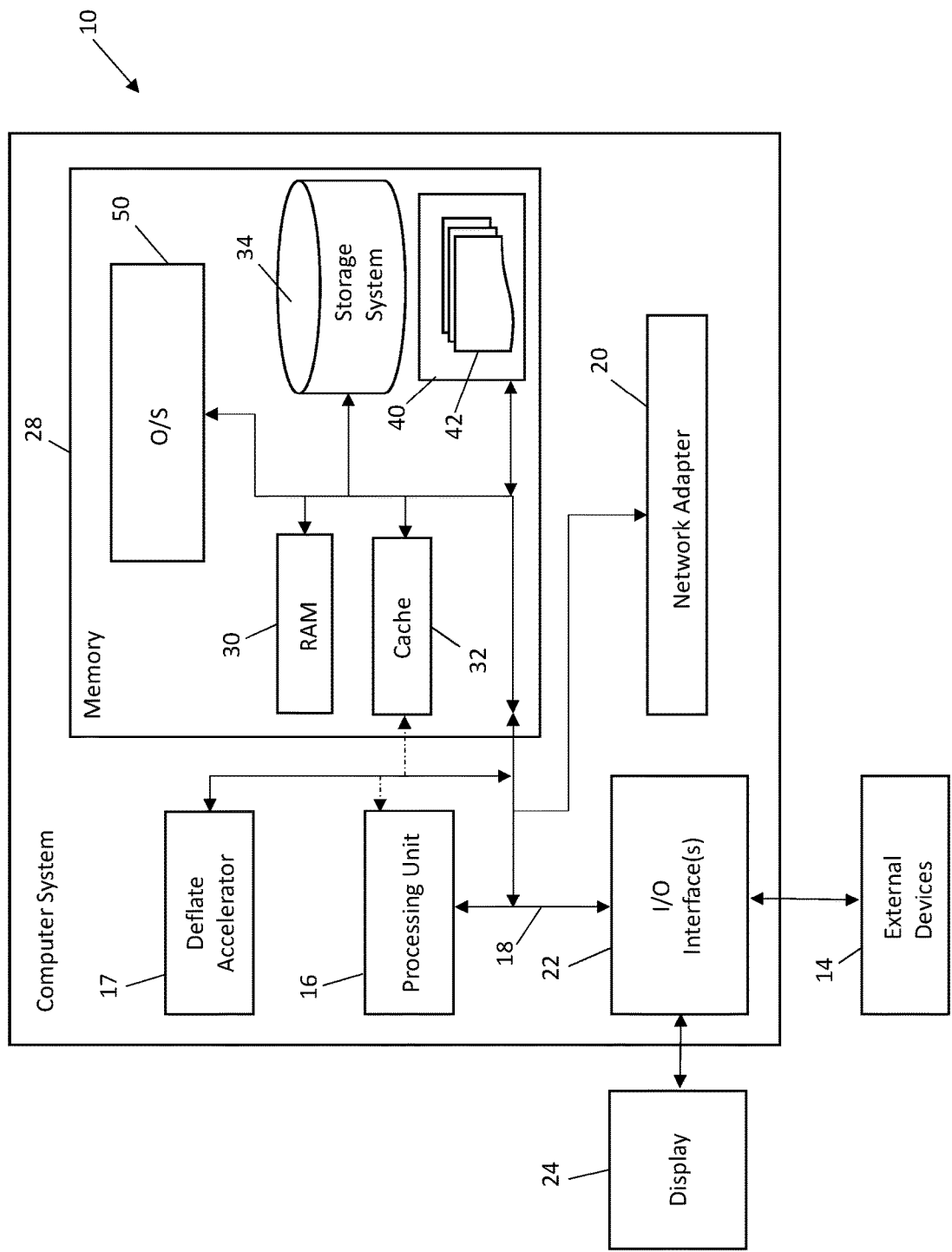
FIG. 1 is a block diagram illustrating a computer system which is capable of compressing and decompressing data in accordance with various embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, the reduction in data-representation size produced by an applied data compression algorithm is typically referred to as the compression ratio. The compression ratio can be defined as the ratio between the uncompressed size and compressed size. Thus, as the compression ratio increases, a more efficient use of the computer system's storage space is achieved, thereby improving the overall performance of the computer system.

The DEFLATE data compression algorithm is a commonly used method for compressing data. When compressing data, there are two main parts to the DEFLATE algorithm: (1) LZ77 compression to identify duplicate strings and (2) the encoding of this information into the compressed format.

The DEFLATE standard supports three types of compressed data blocks: literal copy blocks, Fixed Huffman Table (FHT), and Dynamic Huffman Table (DHT). A DHT block consists of a highly compressed version of a Huffman tree, followed by the symbols, encoded using that tree, representing the compressed data. When a hardware accelerator builds a Huffman tree it uses LZ77 compression as part of that step (called genDHT), and then LZ77 compression is used again on the same data to output the compressed and encoded symbols. Of note is the fact that LZ77 is used twice on the same data under this scheme. Consequently, the LZ77 compression scheme should be repeatable (as described herein, a "repeatable" compression scheme run on the same data set multiple times will produce the same result each time).

Importantly, repeatability enables some testing efficiencies, as test program software is not needed to predict the compression results. Instead, a compression test can be run a single time in hardware and this output becomes the expected reference (expectation) for future executions with the same data.

The LZ77 compression phase attempts to find duplicate strings in the previously encoded source operand. When a match is found, instead of outputting the literal characters of the duplicate string, the LZ77 compression phase instead outputs the "distance" from the duplicate string to the original (matching) string in the prior data set history, along with the matching "length" of the data. For example, suppose the input operand is: ABCDEBCDBBBB. This operand could be encoded as follows:

literal byte A; literal byte B; literal byte C; literal byte D; literal byte E; distance 4, length 3 (this encodes "BCD"); literal byte B; distance 1, length 3 (this encodes "BBB")

As can be seen, the more duplicate strings that can be found in the input operand data, the more the output can be compressed. There are two ways the input operand history can be checked for matching strings: an inline history, and via a circular history buffer.

For inline histories, the LZ77 compressor simply looks at prior input from the source operand. For a circular history buffer, input data is copied (either actually copied or conceptually copied) to a circular history buffer, and then data in this buffer is searched for matches. In either case, the DEFLATE standard allows looking back up to 32 KB for matching strings.

There are many ways to implement the LZ77 compressor in hardware. Typically, one might have a hardware pipeline containing parts of an input that is being hashed to identify duplicate strings. The actual methods used are not meant to be limited, the key point is that matches found by this hardware pipeline are strongly dependent on the implementation of this pipeline.

For a sophisticated hardware design, it is not possible to predict the results of the LZ77 compression by a software test program alone, unless it exactly models the hardware implementation (i.e., a low level/rigorous implementation). However, for improved testing that avoids making the same potential implementation errors as the hardware designers, it is often better to have the software test program take a higher-level approach.

There are a number of techniques that can be used to verify the correctness of a DEFLATE hardware accelerator. For example, the predictability and repeatability of the accelerator can be tested. "Predictability" as used herein refers to the capability of a DEFLATE test to produce expected outputs when providing a hardware accelerator known test inputs. "Repeatability" as used herein refers to the capability of a DEFLATE test to output consistent (same) results over multiple tests if those tests are based on the same input. For example, in some hardware accelerator designs, the compression results might be repeatable, but effectively not predictable without low-level modeling. In other hardware accelerator designs, the compression results will be neither predictable nor repeatable.

One testing technique is to compress pseudo-random input data with the accelerator and then decompress that output data and compare to see if it is equal to the original input data. If the hardware compressor and decompressor are working properly, they must be equivalent.

A second technique involves building a DEFLATE compressor in software to create DEFLATE format data and have the hardware accelerator decompress this data and compare it to the software's input stream. Here, the software would typically create compressed data that is abnormal or non-optimal to ensure the hardware decompressor can handle it correctly. This allows thorough testing of the hardware decompressor but provides no testing of the hardware compressor, since the compression phase is being performed by a software test program.

Ideally, one would like to employ additional techniques to verify the correctness of an accelerator. In a third technique, for example, a software test program predicts the result of the Huffman compression and encoding. In a fourth technique, the hardware compressor compresses a pseudo random input stream and compares it against a software-generated model of what the expected output will be (this technique and its variants are referred to herein as a "comprehensive DEFLATE test"). In this manner, the predictability of the hardware compressor can be measured. This type of implementation could use either a hardware accelerator-created DHT (when creating DHT compressed blocks) or a software-generated DHT. A variant of this technique is to compress the data multiple times using the hardware compressor to ensure that each of these results is identical. In this manner, the repeatability of the hardware compressor can be measured to verify the correctness of an accelerator. Similarly, the repeated tests could use a hardware or software-generated DHT before the actual data compression steps.

All of the above techniques are valuable in testing the design and implementation of a DEFLATE accelerator. However, the third and fourth techniques are problematical, as some conventional hardware accelerator architectures will fail predictability and/or repeatability tests under these schemes. In other words, the third and fourth techniques cannot be guaranteed to work correctly for all possible hardware implementations of a DEFLATE compressor. For example, the third technique can fail to provide predictable results unless implemented in a very low-level fashion such that it exactly models the behavior of the LZ77 compressor, due to the LZ77 compression phase.

Turning now to an overview of the aspects of the inventive teachings, one or more embodiments address the above-described shortcomings of the prior art by providing new hardware and software implementations for verifying the correctness of a hardware DEFLATE compression accelerator. Specifically, these implementations allow for a comprehensive DEFLATE test (correctness test) that overcomes the predictability and repeatability issues associated with conventional testing schemes. While the techniques presented herein are demonstrated with respect to a specific compression algorithm (DEFLATE) for ease of discussion, these techniques are applicable to other compression algorithms, such as Lempel-Ziv-Welch (LZW) compression and others.

As will be discussed in further detail herein, three somewhat independent test configurations are leveraged separately or together to ensure predictability and/or repeatability when testing a hardware DEFLATE accelerator: (1) Provide a switch that a DEFLATE test program can use to disable the LZ77 compression phase; (2) Matching strings across the page boundary are ignored when the input data operand or the circular history buffer crosses a page boundary; and (3) The hash of duplicate strings are not formed across a page boundary.

For the first configuration (addressing the third technique discussed previously herein), to provide predictable results from the DEFLATE compression process when implemented by a sophisticated hardware accelerator (that is, without implementing the test program in a very low-level fashion such that it exactly models the behavior of the LZ77 compressor), the LZ77 phase is disabled. By disabled, we mean that no duplicate string match will be found and only literal bytes will be encoded by the subsequent DEFLATE encoding. To disable the LZ77 phase, a software-controlled switch is provided in the parameter block. In some embodiments of the invention, the software-controlled switch is implemented as a bit in the parameter block. For example, an LZ77 disable bit can be defined as byte 3, bit 0 of the parameter block of the z/Architecture DFLTCC instruction, although other bit locations are within the contemplated scope of the invention.

When the LZ77 disable bit is set to 1 (or, "ON"), it instructs the DEFLATE accelerator hardware to disable LZ77 compression. When a software test program wants to perform a comprehensive DEFLATE test (i.e., the third technique, whereby the hardware compressor compresses a pseudo random input stream and compares it against a software-generated model of what the expected output will be), it can turn on this bit.

In a typical DEFLATE hardware accelerator, there are four complex parts: the LZ77 compressor, the logic that builds the Huffman trees and encodes (referred to as genDHT logic), the logic that takes LZ77 (or just literal bytes if LZ77 is disabled) output and encodes it using the DEFLATE algorithm, and the interaction of the hardware with processor firmware. Providing a switch to disable the LZ77 function allows testing all but the first of these complex functions in a deterministic manner and therefore provides very good test coverage.

It is important to note that while a typical LZ77 compressor can produce repeatable results when starting at the same initial page offset if it is allowed to run to completion without interruption, LZ77 compression is not predictable without low-level modeling of the hardware behavior. If, however, the design of the LZ77 compressor does not even produce repeatable results (perhaps it depends on the timing of input data delivery and would, therefore, be dependent on cache hits and misses), then a software controlled LZ77 switch as described herein can also be used to ensure repeatable compressed data results.

For the second configuration (directed to the fourth technique discussed previously herein), the design of the LZ77 compressor is modified such that it would never find matching strings in the input or history that crossed a page (e.g., 4 KB page) boundary. Modified in this manner, the hardware accelerator will always produce fully repeatable results. The tradeoff is a slight loss in compressibility, as string matches across the boundary are not leveraged for compression.

To illustrate this point consider the following scenario. Suppose the LZ77 compressor could have found matching strings across a 4K boundary. Now suppose that, while processing input data a first time, the LZ77 compressor encounters a page fault on an input page. Obviously, since the LZ77 compressor can not access this new page, the LZ77 compressor cannot continue to look for history matches on the new page. Consequently, the LZ77 compressor will determine whatever matching string length that is available from the data on the last page that was still accessible.

Now suppose that the entire compression operation is repeated again, from the start, but this time the LZ77 compressor does not encounter a page fault. In this scenario the LZ77 compressor might have a longer matching string than was found the first time (since it now considers data from both pages) and the results of the repeated compression operation will be different.

Designing the accelerator such that it never forms a matching string across a page boundary avoids this problem. This applies to both input data and also to implementations where a circular history buffer is used. As mentioned previously herein, the tradeoff is a slight loss in compression. With typical data being compressed, however, the reduction in compression ratio is negligible (e.g., typically less than a 0.5% loss of compression, and usually much less, depending on the data). In return for this small compression loss, the resulting design allows full repeatability of the compression operation. This same technique can be used during both genDHT testing and the actual compressing of the data.

For the third configuration, the LZ77 compressor is modified such that hashes are never formed across a page boundary. To illustrate this point, consider how a hash table might be used to implement the finding of duplicate strings in an LZ77 compressor. A hash table can be used to define one or more symbols, each symbol representing a repeated string in the input data. For example, 3 character symbols can be used for the hash, although other (longer or shorter) size symbols are within the contemplated scope of the invention.

In some embodiments of the invention, a programmable hash character size is provided for constructing a hash table from an arbitrary number of characters. For example, the programmable hash character size can define a hash table having 3 to 8 characters, although other hash tables are within the contemplated scope of the invention.

When the overall duplicate string crosses a page boundary, results of the compression will not reproducible if the characters in the hash string cross a page boundary. This occurs for a similar reason as explained previously with respect to matching strings that cross a page boundary.

For example, if the programmable hash character size is set for 8, and the first 8 characters in a string-match cross a page boundary, the results would be non-reproducible. To address this, the LZ77 compressor is modified to include only the number of characters that would fit on a page (e.g., a 4 KB page) into the hash. Remaining positions in the hash are filled with a fixed character value (for example, zero, or some other fixed or predetermined character). This technique can be used during both genDHT testing and the actual compressing of the data.

An example of this technique is provided for ease of discussion. Suppose the following sequence occurs at some offset within a page of size 0xFFE, with remaining bytes on the next page: "0x1234]56789ABCDEF0123456 . . . ". Assuming that only the first two bytes of this input, "0x1234," are contained on the first page, the LZ77 compressor can form a hash value (using an 8-byte hash) of: "0x1234000000000000" (note 0x00 characters fill unused positions because only 2 bytes are available on the first page). The next potential hash begins on the next page and begins with: "0x56789A . . . ".

In some embodiments of the invention, as an alternative method to using a fixed fill character, an entry into the hash table is simply not placed if the hash would cross a page boundary. Similarly, as described for the general case of matching strings across a page boundary, modifying the LZ77 compressor such that hashes are never formed across a page boundary has a negligible impact on the overall compression ratio (e.g., typically less than a 0.5% loss of compression, and usually much less, depending on the data), but allows for significantly better testing of the LZ77 compression hardware because results are now reproducible.

With reference now to FIG. 1, a computer system 10 is illustrated in accordance with a non-limiting embodiment of the present disclosure. The computer system 10 can be based on the z/Architecture, for example, offered by International Business Machines Corporation (IBM). This architecture, however, is but one example of the computer system 10 and is not intended to suggest any limitation as to the scope of use or functionality of embodiments described herein. Other system configurations are possible. Regardless, computer system 10 is capable of being implemented and/or performing any of the functionality set forth hereinabove.

Computer system 10 is operational with numerous other general purpose or special purpose computing system environments or configurations. Examples of well-known computing systems, environments, and/or configurations that may be suitable for use with computer system 10 include, but are not limited to, personal computer systems, server computer systems, thin clients, thick clients, cellular telephones, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 10 may be described in the general context of computer system-executable instructions, such as program modules, being executed by the computer system 10. Generally, program modules may include routines, programs, objects, components, logic, data structures, and so on that perform particular tasks or implement particular abstract data types. Computer system 10 may be practiced in distributed cloud computing environments where tasks are performed by remote processing devices that are linked through a communications network. In a distributed computing environment, program modules may be located in both local and remote computer system storage media including memory storage devices.

As shown in FIG. 1, computer system 10 is depicted in the form of a general-purpose computing device, also referred to as a processing device. The components of computer system 10 may include, but are not limited to, one or more processors or processing unit(s) 16, a deflate accelerator 17, a system memory 28, and a bus 18 that couples various system components including system memory 28 to processing unit 16.

Figure 3:
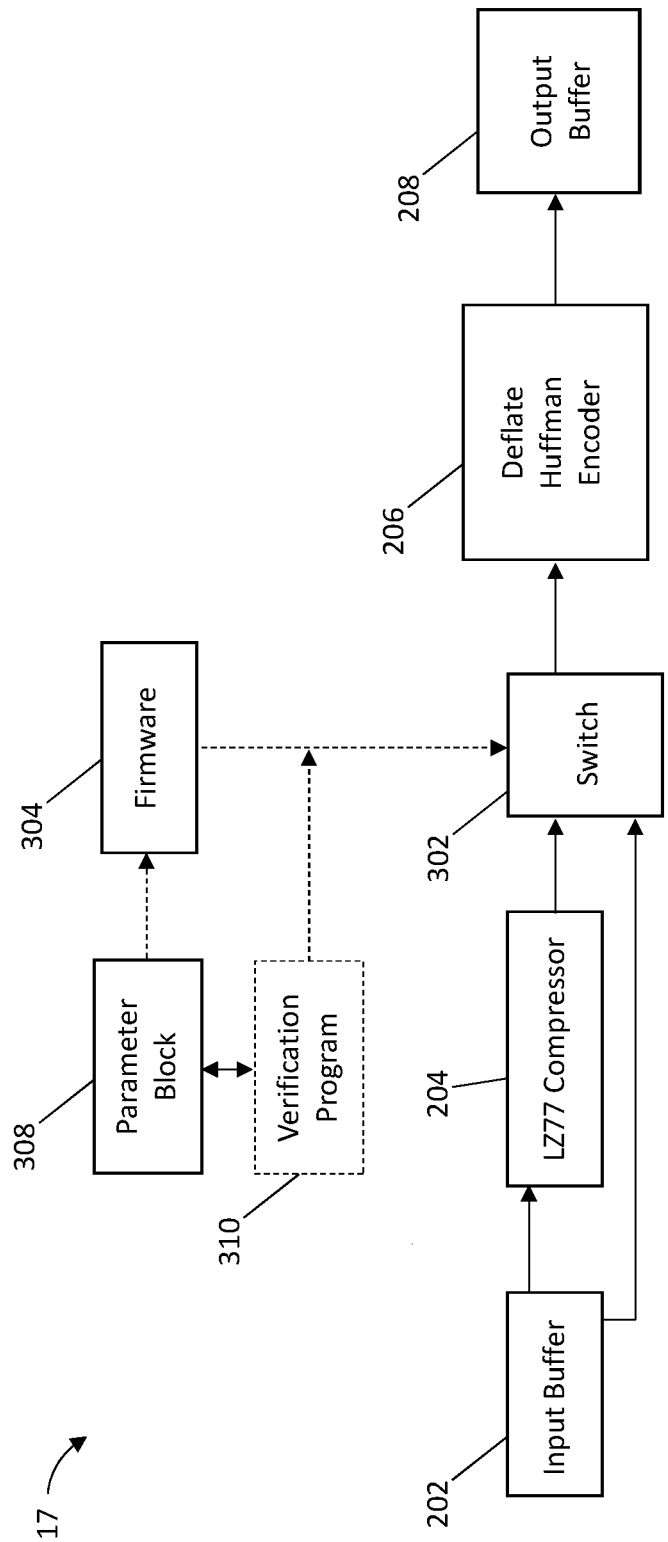
FIG. 3 is a block diagram of a DEFLATE accelerator according to one or more embodiments.

The deflate accelerator 17 can be implemented as hardware or as both hardware and software and can include functionality and modules for compressing data using the DEFLATE data compression algorithm according to one or more embodiments. In some embodiments of the invention, the deflate accelerator 17 can receive data on an input buffer, process the data using an LZ77 compressor, encode the data using a Huffman encoder, and output the data to an output buffer. An embodiment of the deflate accelerator 17 is depicted in FIG. 3. In some embodiments of the invention, the deflate accelerator 17 includes a hardware or software switch that can be toggled to disable the LZ77 compressor. When the LZ77 compressor is disabled, the Huffman encoder only uses literals that come directly from the input data buffer. In other words, the LZ77 compressor can be bypassed.

In some embodiments of the invention, the deflate accelerator 17 can be connected directly to the bus 18 (as depicted). In some embodiments of the invention, the deflate accelerator 17 is connected to the bus 18 between the RAM 30/cache 32 and the processing unit 16. In some embodiments of the invention, the deflate accelerator 17 is directly connected to the cache 32 (e.g., to the L3 cache), rather than to the bus 18. In some embodiments of the invention, the deflate accelerator 17 is directly connected to the processing unit 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that is accessible by computer system/server 10, and it includes both volatile and non-volatile media, removable and non-removable media.

System memory 28 can include an operating system (OS) 50, along with computer system readable media in the form of volatile memory, such as random access memory (RAM) 30 and/or cache 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

The OS 50 controls the execution of other computer programs and provides scheduling, input-output control, file and data management, memory management, and communication control and related services. The OS 50 can also include a library API (not shown in FIG. 1). The library API is a software library that includes APIs for performing the data manipulation functions provided by the specialized hardware devices such as, for example, an accelerator (not shown in FIG. 1).

The storage system 34 can store a basic input output system (BIOS). The BIOS is a set of essential routines that initialize and test hardware at startup, start execution of the OS 50, and support the transfer of data among the hardware devices. When the computer system 10 is in operation, one or more of the processing units 16 are configured to execute instructions stored within the storage system 34, to communicate data to and from the memory 28, and to generally control operations of the computer system 10 pursuant to the instructions.

One or more of the processing unit 16 can also access internal millicode (not depicted) and data stored therein. The internal millicode (sometimes referred to as firmware) can be viewed as a data storage area that is separate and different from the main memory 28 and can be accessed or controlled independent from the OS. The internal millicode can contain part of the complex architected instructions of the computer system 10. A complex instruction can be defined as a single instruction to the programmer; however, it may also include internally licensed code which breaks one complex instruction into many less complex instructions. The millicode contains algorithms that have been designed and tested specifically for computer system 10 and can provide full control over the hardware. In at least one embodiment, the millicode can also be utilized to store one or more compression dictionaries, which can be delivered to the hardware to facilitate data decompression as described in greater detail below.

Program/utility 40, having a set (at least one) of program modules 42, may be stored in memory 28 by way of example, and not limitation, as well as the OS 50, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 10 may also communicate with one or more external devices 14 such as a keyboard, a pointing device, a display 24, etc.; one or more devices that enable a user to interact with computer system/server 10; and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, data archival storage systems, etc.

Various types of compression algorithms can be utilized in the computer system 10 such as, for example, an adaptive lossless data compression (ALDC) family of products which utilize a derivative of Lempel-Ziv encoding to compress data. As a general compression technique, the Lempel-Ziv 77 (LZ77) algorithm integrates well into systems required to handle many different data types. This algorithm processes a sequence of bytes by keeping a recent history of the bytes processed and pointing to matching sequences within the history. Compression is achieved by replacing matching byte sequences with a copy pointer and length code that together are smaller in size than the replaced byte sequence.

The compression algorithm can also include the "DEFLATE" compression format, which uses a combination of the LZ77 algorithm (which removes repetitions from the data) and Huffman coding. The Huffman encoding is entropy encoding that is based on a "Huffman tree". To Huffman encode and decode data, a system must know in advance that the Huffman tree is being used. To accommodate decompression (e.g., an "Inflate" operation), the Huffman tree is written at the header of every compressed block. In one embodiment, two options are provided for Huffman trees in the Deflate standard. One option is a "static" tree, which is a single hard-coded Huffman tree, known to all compressors and decompressors. The advantage of using this static tree is that its description does not have to be written in the header of a compressed block, and is ready for immediate decompression. On the other hand, "dynamic" trees are tailored for the data block at hand and an exact description of the dynamic tree must, therefore, be written to the output.

Huffman encoding may also use a variable-length code table based on entropy to encode source symbols, and as previously mentioned, is defined either as either static or dynamic. In static Huffman coding, each literal or distance is encoded using a fixed table (SHT) that is defined in the RFC. In dynamic Huffman coding, however, special coding tables (DHTs) are constructed to better suit the statistics of the data being compressed. In most cases, using a DHT achieves better compression ratio (e.g., quality) when compared to SHT, at the expense of degrading the compression rate (e.g., performance) and adding design complexity. The static and dynamic Huffman encoding methods best reflect the built-in tradeoff between compression rate and ratio. The static Huffman method may achieve a worse compression ratio than is possible. This is due to using a fixed encoding table regardless of the content of the input data block. For example, random data and a four-letter DNA sequence would be encoded using the same Huffman table.

In some embodiments of the invention, the computer system 10 includes a compression library that can be implemented as a software library used for deflation/inflation and can be an abstraction of a compression algorithm. In at least one embodiment, the compression library allows the computer system 10 and/or the deflate accelerator 17 to break up input data to be deflated/inflated in arbitrary ways across multiple requests and provides arbitrary sized output buffers to hold the results of the deflate/inflate operation.

Figure 2:
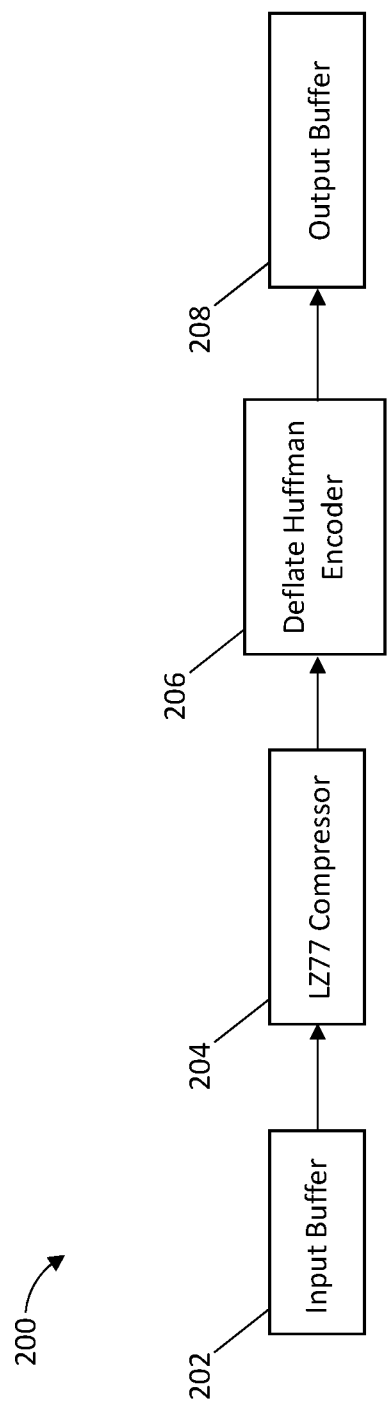
FIG. 2 is a block diagram of a traditional DEFLATE accelerator.

FIG. 2 depicts a block diagram of a traditional DEFLATE accelerator 200. The DEFLATE accelerator 200 can include, for example, an input buffer 202, an LZ77 compressor 204, a DEFLATE Huffman encoder 206, and an output buffer 208. As shown in FIG. 2, the output from the LZ77 compressor 204 is directly connected to the input of the DEFLATE Huffman encoder 206. In this manner, the DEFLATE accelerator 200 is configured to facilitate data compression using the DEFLATE algorithm.

In some embodiments of the invention, uncompressed data is obtained by the DEFLATE accelerator 200 on the input buffer 202 (sometimes referred to as an input data buffer). In some embodiments of the invention, the DEFLATE accelerator 200 performs an LZ77 compression on the data provided to the input buffer 202. In some embodiments of the invention, the compressed data is received by, and encoded by, the deflate Huffman encoder. The compressed and encoded data can be stored in the output buffer 208 (sometimes referred to as an output data buffer).

FIG. 3 depicts a block diagram of a DEFLATE accelerator 17 according to one or more embodiments. The DEFLATE accelerator 17 can include, for example, an input buffer 202, an LZ77 compressor 204, a DEFLATE Huffman encoder 206, and an output buffer 208. Unlike the traditional DEFLATE accelerator 200, however, the output from the LZ77 compressor 204 is not directly connected to the input of the DEFLATE Huffman encoder 206. Instead, the DEFLATE accelerator 17 includes a switch 302 communicatively coupled to the output of the LZ77 compressor 204 as well as the output of the input buffer 202.

In some embodiments of the invention, the switch 302 can be toggled between two states. In the first state, the LZ77 compressor 204 is enabled, and the output from the LZ77 compressor 204 is passed through the switch 302 to the deflate Huffman encoder 206. In the second state, the LZ77 compressor 204 is bypassed (disabled). When in the second state, the data in the input buffer 202 is directly passed (though the switch 302) to the deflate huffman encoder 206, without undergoing the LZ77 compression phase. In other words, the switch 302 can be used to disable the LZ77 compressor 204 and instead use only literals that come directly from the input buffer 202. As described previously herein, disabling the LZ77 compression phase when testing the LZ77 compressor 204 allows for predictable results without needing to resort to implementing the test program in a very low-level fashion (e.g., such that it exactly models the behavior of the LZ77 compressor 204).

In some embodiments of the invention, the switch 302 is controlled by firmware 304 (sometimes referred to as millicode). In some embodiments of the invention, the firmware 304 decides how to set the switch 302 based on the value of a control bit in a parameter block 308 of the compression instructions (received, e.g., from the processing unit 16.

In some embodiments of the invention, the DEFLATE accelerator 17 is configured as a pure hardware implementation, without firmware 304. In these embodiments the state of the switch 302 can be controlled directly from the parameter block 308, from a field in the instruction, or from a control bit in a register (not depicted).

In some embodiments of the invention, the DEFLATE accelerator 17 includes a verification program 310 (sometimes referred to as a DEFLATE verification program or a test program). The verification program 310 can be used to verify the correctness of the DEFLATE accelerator 17 according to one or more embodiments. In some embodiments of the invention, the verification program 310 creates the parameter block 308 and controls the state of the switch 302 to disable the LZ77 compressor 204 during at least one test of the DEFLATE accelerator 17.

In some embodiments of the invention, the verification program 310 causes the DEFLATE accelerator 17 to compress a pseudo random input stream and compares the output to a software-generated expected output (i.e., to determine whether the DEFLATE accelerator 17 output is predictable as part of a correctness test). In some embodiments of the invention, the verification program 310 causes the DEFLATE accelerator 17 to compress the pseudo random input stream several times (2, 3, 5, 10, etc.) to ensure that each of the results is identical (i.e., to determine whether the DEFLATE accelerator 17 output is repeatable as part of a correctness test).

To initiate data compression, the DEFLATE accelerator 17 can receive one or more requests to compress targeted data or a targeted data stream in the input buffer 202. In some embodiments of the invention, a request block (not depicted) can be used to facilitate the request. In some embodiments of the invention, the request block is delivered to a compression interface of the OS 50. For each request, the computer system 10 can supply an input buffer (e.g., the input buffer 202) with the data to be processed and an output buffer (e.g., the output buffer 208) where the processed data results are stored.

In some embodiments of the invention, to begin processing a compression request, the DEFLATE accelerator 17 reads a request block, and processes the data in the input buffer 202 to generate compressed or and/or decompressed data. As described herein, various compression algorithms can be employed including, but not limited to, the DEFLATE compression algorithm and ALDC algorithms. The resulting compressed data can be saved in the output buffer 208.

Figure 4:
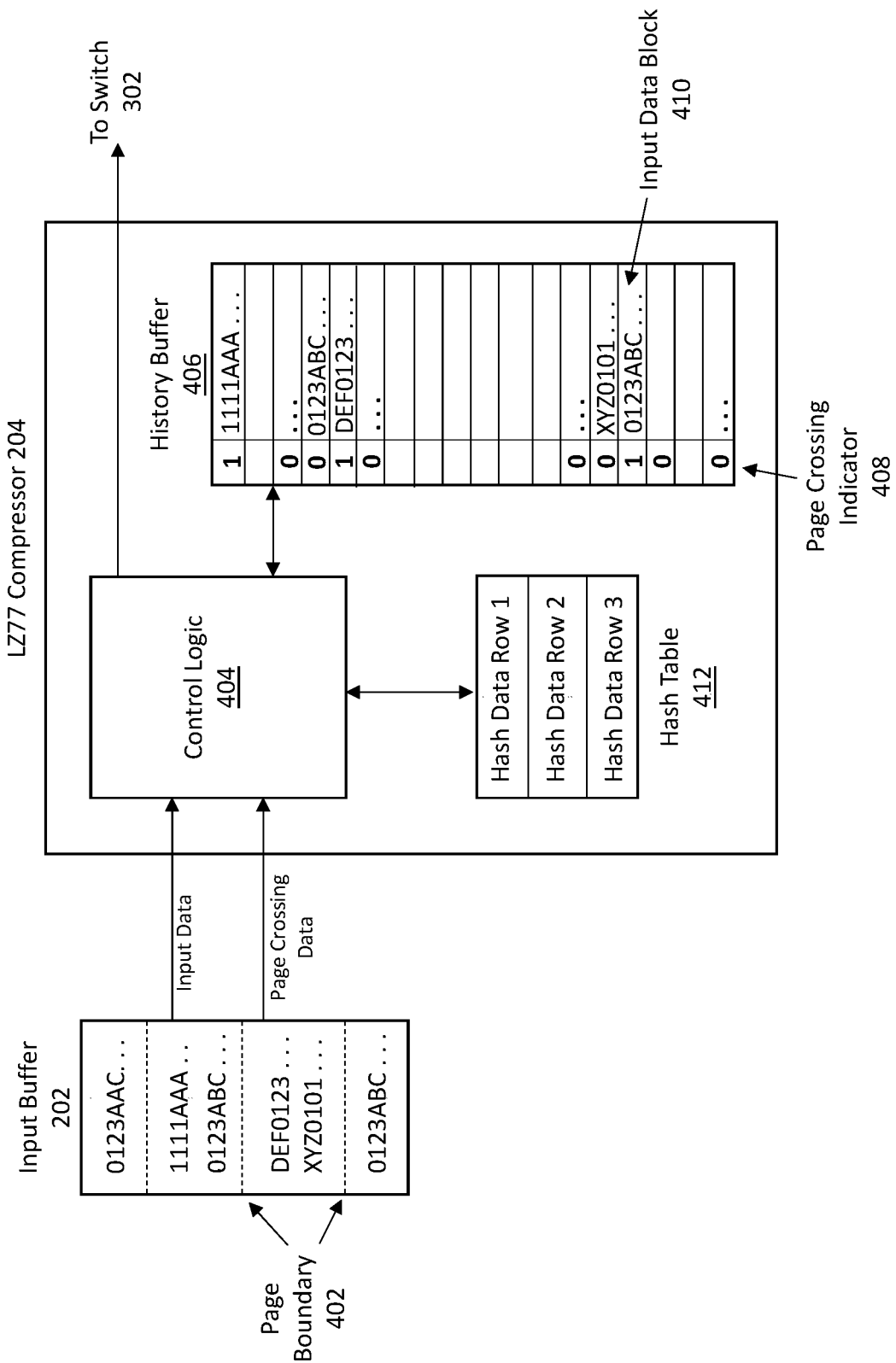
FIG. 4 illustrates portions of the DEFLATE accelerator depicted in FIG. 3.

FIG. 4 depicts detailed portions of the DEFLATE accelerator 17 according to one or more embodiments. As depicted in FIG. 4, the input buffer 202 can include enough data to cross one or more page boundaries 402. For example, the input buffer 202 can include data across two or more 4 KB pages, although other page sizes are within the contemplated scope of the invention. In some embodiments of the invention, this page crossing information ("Page Crossing Data" in FIG. 4) is conveyed to the LZ77 compressor 204 control logic 404 (sometimes referred to as Matching String Search Logic).

In some embodiments of the invention, the LZ77 compressor 204 continually or periodically updates a history buffer 406 with the input data and page crossing data received from the input buffer 202. When configured for DEFLATE compression, the history buffer 406 is a 32 KB history buffer (a 32 KB size is fixed by the DEFLATE algorithm definition), although other sizes are within the contemplated scope of the invention.

In some embodiments of the invention, the history buffer 406 includes a page crossing indicator 408 and an input data block 410. The input data block 410 can include the raw, byte by byte input data from the input buffer 202. The page crossing indicator 408 includes an indicator (indication bit) that is set to "1" (although any indication value can be used to indicate a page crossing) if the byte corresponding to that indicator (e.g., the byte on the same row as the page crossing indicator in the history buffer 406) is the first byte on a page (or alternatively, the indication can be for the last byte of a page). In either case, the history buffer 406 can track the location of each page boundary 402. While illustrated as 1 bit of page crossing information recorded for every byte of input data, other configurations are possible and within the contemplated scope of the disclosure.

In some embodiments of the invention, the control logic 404 augments the LZ77 compression matching string algorithm by searching the history buffer 406 to ensure that it never chooses matching strings if the page crossing bit is on (or "1") for any byte, except the first byte in that matching string. In this manner, matching strings will never cross a page boundary. As discussed previously herein, modifying the LZ77 compressor 204 such that it would never find matching strings that cross a page boundary allows for the LZ77 compressor 204 to produce fully repeatable results.

In some embodiments of the invention, the control logic 404 can chose a matching string, even if it crossed a page boundary, so long as the length of the matching string only includes up to the number of bytes that the page crossing indicator bit is not set (except for the first byte of the string which can be the first byte on a page). In other words, a matching string that crosses a page boundary can be truncated to a maximum length that does not cross a page boundary prior to using that matching string in the LZ77 compression phase.

In some embodiments of the invention, the LZ77 compressor 204 includes a hash table 412. As depicted, the hash table 412 includes various hash data rows (rows 1, 2, 3), although any number of hash data rows are within the contemplated scope of the invention. The hash table 412 can be populated with one or more hashes generated from the data in the input buffer 202. For example, the hash table 412 can be used to define one or more symbols, each symbol representing a repeated string in the input data. In some embodiments of the invention, the control logic 404 searches the hash table 412 to find potential matches in the main history buffer (e.g., the history buffer 406). In this manner, the search for matching strings can be accelerated.

In some embodiments of the invention, the hash table 412 is modified such that hashes are never formed across a page boundary. For example, the hashing algorithm can be modified to ignore data that crosses a page boundary. In some embodiments of the invention, candidate hashes are modified to only include the number of characters that would fit on a page (e.g., "0x1234000000000000" can be used with "0x00" characters filling unused positions when only 2 bytes are available on the first page). In some embodiments of the invention, candidate hashes that cross a page boundary are rejected (not entered into the hash table 412). In this manner, as hashes are added to the table, the data bytes that are hashed never cross a page boundary. As discussed previously herein, modifying the LZ77 compressor 204 such that it would never generate a hash that crosses a page boundary allows for the LZ77 compressor 204 to produce fully repeatable results.

Figure 5:
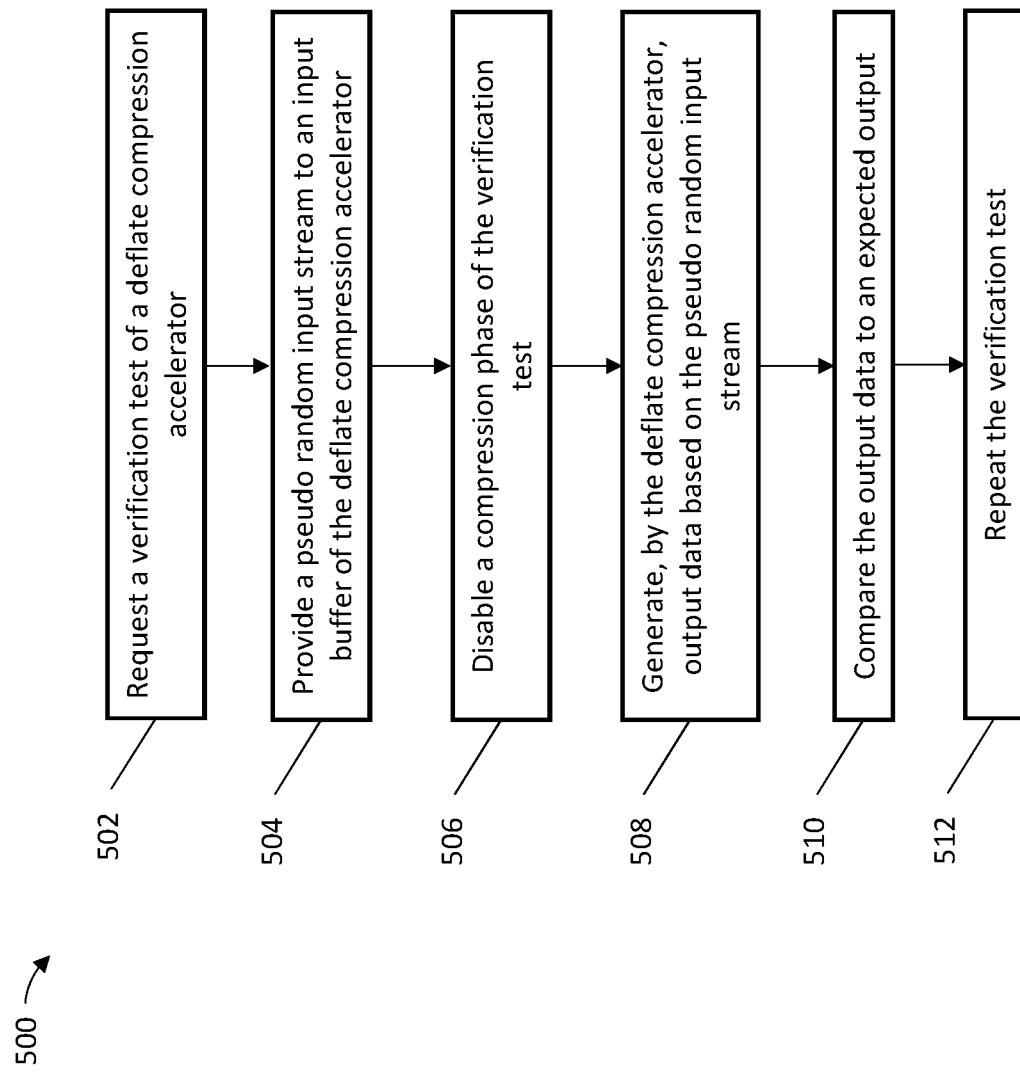
FIG. 5 is a flow diagram illustrating a method according to a non-limiting embodiment.

FIG. 5 depicts a flow diagram 500 illustrating a method for verifying the correctness of a deflate compression accelerator according to a non-limiting embodiment. As shown at block 502, a request is made (from, e.g., a test program) for a verification test of the deflate compression accelerator. At block 504, a pseudo random input stream is stored on an input buffer of the deflate compression accelerator.

At block 506, the test program disables the compression phase of the verification test. As discussed previously herein, the compression phase can include an LZ77 compression phase, although other compression phases (e.g., LZ78, LZW, etc.) are within the contemplated scope of the invention. At block 508, the deflate compression accelerator generates output data based on the pseudo random input stream.

At block 510, the method includes generating an expected output of the compression test and comparing the output data to the expected output (by, e.g., the software test program). In this manner, the predictability of the deflate compression accelerator can be tested. At block 512, the method includes repeating the verification test a plurality of times to generate a plurality of sets of output data and determining if the plurality of sets of output data are identical. In this manner, the repeatability of the deflate compression accelerator can be tested.

The method can further include configuring the deflate compression accelerator with a switch. The switch can be configured to bypass a compressor (e.g., an LZ77 compressor) of the deflate compression accelerator. The switch can be directly coupled to the input buffer. The method can further include setting a control bit in the switch to bypass the compressor.

Figure 6:
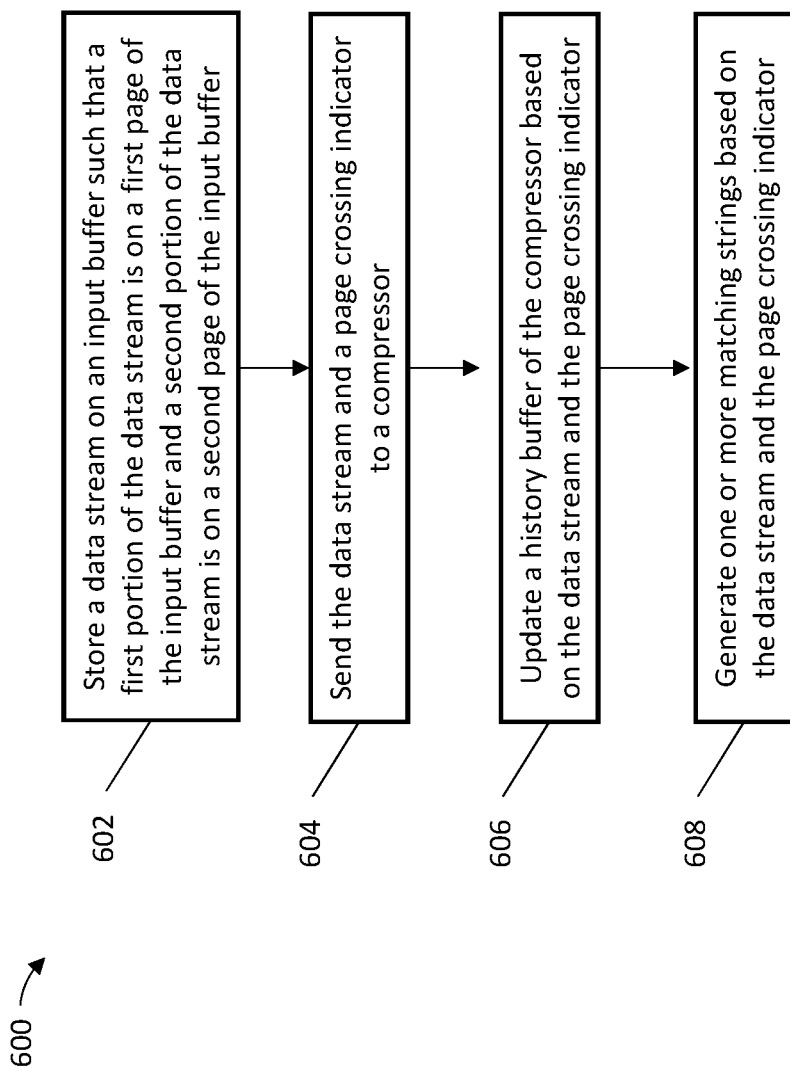
FIG. 6 is a flow diagram illustrating a method according to another non-limiting embodiment.

FIG. 6 depicts a flow diagram 600 illustrating a method for compressing a data stream with a compression accelerator according to a non-limiting embodiment. As shown at block 602, a data stream is stored on an input buffer. Due to page size limits, a first portion of the data stream can be stored on a first page of the input buffer and a second portion of the data stream can be stored on a second page of the input buffer (i.e., the data stream cannot fit on a single page). In some embodiments of the invention, each page of the input buffer has a size of 4 kilobytes.

At block 604, the data stream and a page crossing indicator are received by a compressor. As discussed previously herein, the compressor can include an LZ77 compressor, although other compressors (e.g., an LZ78 compressor, an LZW compressor, etc.) are within the contemplated scope of the invention. The page crossing indicator can be associated with the first byte of the data stream that occurs on the second page of the input buffer.

At block 606, a history buffer of the compressor is updated based on the data stream and the page crossing indicator. For example, the history buffer can be updated with input data blocks and page crossing indicators as discussed with respect to the compressor depicted in FIG. 4. In some embodiments of the invention, the history buffer includes a buffer size of 32 kilobytes.

At block 608, the compressor generates one or more matching strings based on the data stream and the page crossing indicator. The matching strings can be generated according to one or more embodiments, such as, for example, using an LZ77 or DEFLATE algorithm. In some embodiments of the invention, the compressor is configured to ignore matching strings based on the page crossing indicator. In some embodiments of the invention, the compressor is configured to truncate a matching string associated with a portion of the data stream that crosses a page boundary.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An accelerator comprising:
an input buffer;
a compressor communicatively coupled to an output of the input buffer;
a switch configured to bypass the compressor during a compression test, the switch communicatively coupled to the output of the input buffer and to an output of the compressor;
a deflate Huffman encoder communicatively coupled to an output of the switch; and
an output buffer communicatively coupled to the deflate Huffman encoder;
wherein the compressor is configured to ignore matching strings in the input buffer that cross a page boundary.

2. The accelerator of claim 1, wherein the accelerator comprises a DEFLATE hardware accelerator.

3. The accelerator of claim 1, wherein the compressor is configured to compress data in the input buffer according to a compression algorithm.

4. The accelerator of claim 1, wherein the compressor comprises:
control logic;
a history buffer; and
a hash table.

5. The accelerator of claim 4, wherein the history buffer comprises a page crossing indicator.

6. The accelerator of claim 4, wherein the compressor is configured to prevent hashing of duplicate strings that cross a page boundary.

7. An LZ77 compressor comprising:
control logic communicatively coupled to the output of an input buffer;
a history buffer communicatively coupled to the control logic, the history buffer comprising a page crossing indicator, wherein the history buffer comprises a plurality of input data blocks, each input data block associated with a page crossing indicator bit; and
a hash table communicatively coupled to the control logic;
wherein a value of a page crossing indicator bit can be set to indicate that an input data block is a first byte on a page of the input buffer.

8. The LZ77 compressor of claim 7, wherein an output of the control logic is communicatively coupled to an input of a switch configured to bypass the LZ77 compressor during a compression test.

9. The LZ77 compressor of claim 7, wherein the control logic is configured to ignore matching strings in the input buffer that cross a page boundary.

10. The LZ77 compressor of claim 7, wherein the control logic is configured to prevent hashing of duplicate strings that cross a page boundary.

11. An accelerator comprising:
an input buffer;
a compressor communicatively coupled to an output of the input buffer;
a switch configured to bypass the compressor during a compression test, the switch communicatively coupled to the output of the input buffer and to an output of the compressor;
a deflate Huffman encoder communicatively coupled to an output of the switch; and
an output buffer communicatively coupled to the deflate Huffman encoder;
wherein the compressor is configured to prevent hashing of duplicate strings that cross a page boundary.

* * * * *